(12) United States Patent
Chou

(10) Patent No.: US 7,683,677 B2
(45) Date of Patent: Mar. 23, 2010

(54) SAMPLE-AND-HOLD AMPLIFICATION CIRCUITS

(75) Inventor: Yu-Kai Chou, Kaohsiung (TW)

(73) Assignee: Mediatek Inc., Hsin-Chu (TW)

( * ) Notice: Subject to any disclaimer, the term of this patent is extended or adjusted under 35 U.S.C. 154(b) by 0 days.

(21) Appl. No.: 12/145,676

(22) Filed: Jun. 25, 2008

(65) Prior Publication Data

US 2009/0039925 A1 Feb. 12, 2009

Related U.S. Application Data

(60) Provisional application No. 60/954,071, filed on Aug. 6, 2007.

(51) Int. Cl.
*G11C 27/02* (2006.01)
(52) U.S. Cl. ............... 327/95; 327/91; 327/94
(58) Field of Classification Search ............ 327/91, 327/94, 95
See application file for complete search history.

(56) References Cited

U.S. PATENT DOCUMENTS

| | | | | |
|---|---|---|---|---|
| 4,823,027 A | * | 4/1989 | Takahashi | 327/94 |
| 5,506,526 A | * | 4/1996 | Seesink | 327/91 |
| 5,698,999 A | * | 12/1997 | Etoh et al. | 327/94 |
| 6,313,668 B1 | * | 11/2001 | Savage | 327/94 |
| 6,563,348 B1 | * | 5/2003 | Beck et al. | 327/94 |
| 7,113,116 B2 | * | 9/2006 | Brewer et al. | 341/122 |
| 7,271,625 B2 | * | 9/2007 | Yen et al. | 327/94 |
| 7,397,287 B2 | * | 7/2008 | Makihara | 327/91 |
| 7,403,046 B2 | * | 7/2008 | Yen et al. | 327/95 |
| 7,423,458 B2 | * | 9/2008 | Aghtar | 327/91 |
| 7,541,846 B2 | * | 6/2009 | Yen et al. | 327/91 |
| 2007/0001891 A1 | | 1/2007 | Mazhar | |

* cited by examiner

*Primary Examiner*—Kenneth B. Wells
(74) *Attorney, Agent, or Firm*—Thomas, Kayden, Horstemeyer & Risley

(57) ABSTRACT

A sample-and-hold amplification circuit comprises an amplifier, a first sample-and-hold unit, and a second sample-and-hold unit. The amplifier has an input terminal and an output terminal. The first sample-and-hold unit is coupled to the input terminal and the output terminal. The second sample-and-hold unit is coupled to the input terminal and the output terminal. When the first sample-and-hold unit is arranged to perform a sampling operation, the second sample-and-hold unit performs a holding operation, and when the first sample-and-hold unit is arranged to perform the holding operation, the second sample-and-hold unit performs the sampling operation.

15 Claims, 7 Drawing Sheets

SAMPLE-AND-HOLD AMPLIFICATION CIRCUITS

CROSS REFERENCE TO RELATED APPLICATIONS

The present application claims the benefit of U.S. provisional application entitled "SAMPLE-AND-HOLD AMPLIFICATION CIRCUITS", Ser. No. 60/954,071, filed Aug. 6, 2007, the subject matter of which is incorporated herein by reference.

BACKGROUND OF THE INVENTION

1. Field of the Invention

The invention relates to a sample-and-hold amplification circuit, and more particularly to a sample-and-hold amplification circuit which simultaneously perform sampling and holding operations.

2. Description of the Related Art

FIG. 1 shows a conventional sample-and-hold amplification circuit. As shown in FIG. 1, a sample-and-hold amplification circuit 1 comprises an amplifier 10, pass switches A1-A6 and B1-B4, and capacitors C1-C4. The pass switches A1-A3 and B1-B2 and the capacitors C1-C2 form sample-and-hold unit 11. The pass switches A4-A6 and B3-B4 and the capacitors C3-C4 form sample-and-hold unit 12. The pass switches A1-A6 are turned on according to a sample clock signal CL11, while the pass switches B1-B4 are turned on according to a hold clock signal CL12. The sample clock signal CL11 is inverse to the hold clock signal CL12.

When the sample clock signal CL11 is active, the pass switches A1-A6 are turned on while the pass switches B1-B4 are turned off, and positive input voltage Vip and negative input voltage Vin are respectively stored into capacitors C1 and C3, such that both of the sample-and-hold units 11 and 12 perform sampling operations. When the hold clock signal CL12 is active, the pass switches A1-A6 are turned off while the pass switches B1-B4 are turned on, and the stored positive input voltage Vip and negative input voltage stored Vin are coupled into the amplifier 10, such that both of the sample-and-hold units 11 and 12 perform holding operations. The amplifier 10 thus generates output voltage signals. Each sample-and-hold unit performs the sampling or holding operation once, in other words, the sampling and holding operations are not performed simultaneously by this architecture.

BRIEF SUMMARY OF THE INVENTION

Sample-and-hold amplification circuits are provided. An exemplary embodiment of a sample-and-hold amplification circuit comprises an amplifier, a first sample-and-hold unit, and a second sample-and-hold unit. The amplifier has an input terminal and an output terminal. The first sample-and-hold unit is coupled to the input terminal and the output terminal. The second sample-and-hold unit is coupled to the input terminal and the output terminal. When the first sample-and-hold unit is arranged to perform a sampling operation, the second sample-and-hold unit performs a holding operation. When the first sample-and-hold unit is arranged to perform the holding operation, the second sample-and-hold unit performs the sampling operation.

Another exemplary embodiment of a sample-and-hold amplification circuit comprises an amplifier, a first sample-and-hold unit, and a second sample-and-hold unit. The amplifier has a first-polarity input terminal, a second-polarity input terminal, a first-polarity output terminal, and a second-polarity output terminal. The first sample-and-hold unit is coupled to the first-polarity input terminal and the second-polarity output terminal. The second sample-and-hold unit is coupled to the second-polarity input terminal and the first-polarity output terminal. When the first sample-and-hold unit is arranged to perform a sampling operation, the second sample-and-hold unit performs a holding operation. When the first sample-and-hold unit is arranged to perform the holding operation, the second sample-and-hold unit performs the sampling operation.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 2:
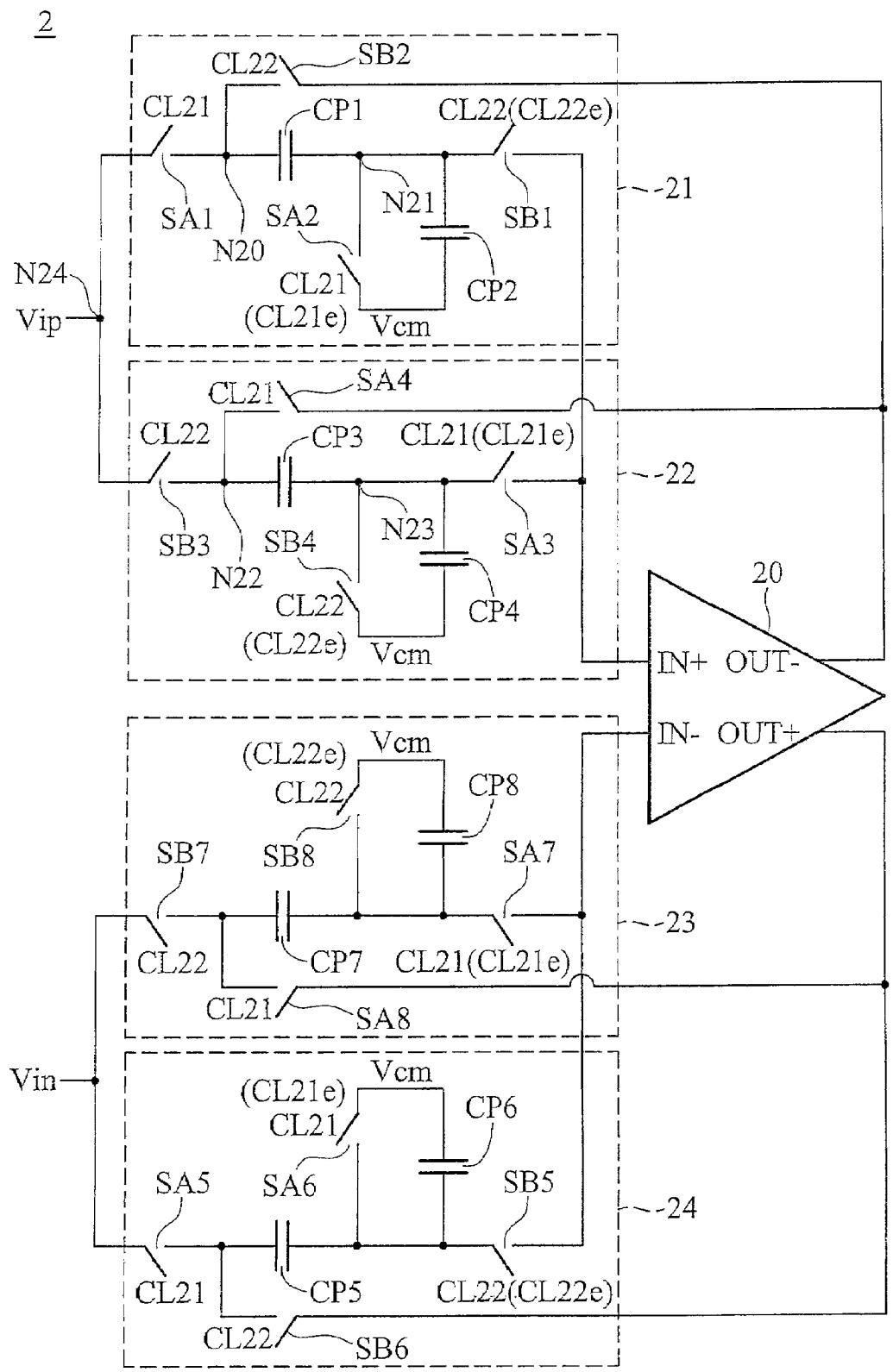
FIG. 2 shows an exemplary embodiment of a sample-and-hold amplification circuit.

FIG. 2 shows an exemplary embodiment of a sample-and-hold amplification circuit. A sample-and-hold amplification circuit 2 comprises an amplifier 20, pass switches SA1-SA8 and SB1-SB8, and capacitors CP1-CP8. The amplifier 20 has a positive input terminal IN+, a negative input terminal IN−, a positive output terminal OUT+, and a negative output terminal OUT−.

The pass switches SA1, SA2, SB1, and SB2 and the capacitors CP1 and CP2 form a sample-and-hold unit 21 coupled to the positive input terminal IN+ and the negative output terminal OUT−. Referring to FIG. 2, the pass switch SA1 is coupled between nodes N24 and N20. The capacitor CP1 is coupled between the nodes N20 and N21. The pass switch SA2 and the capacitor CP2 are coupled in parallel between the node N21 and a common voltage Vcm. The pass switch SB1 is coupled between the node N21 and the positive input terminal IN+. The pass switch SB2 is coupled between the node N20 and the negative output terminal OUT−.

The pass switches SA3, SA4, SB3, and SB4 and the capacitors CP3 and CP4 form a sample-and-hold unit 22 coupled to the positive input terminal IN+ and the negative output terminal OUT−. Referring to FIG. 2, the pass switch SB3 is coupled between nodes N24 and N22. The capacitor CP3 is coupled between the nodes N22 and N23. The pass switch SB4 and the capacitor CP4 are coupled in parallel between the node N23 and the common voltage Vcm. The pass switch SA3 is coupled between the node N23 and the positive input terminal IN+. The pass switch SA4 is coupled between the node N22 and the negative output terminal OUT−.

The pass switches SA5, SA6, SB5, and SB6 and the capacitors CP5 and CP6 form a sample-and-hold unit 24 coupled to the negative input terminal IN− and the positive output terminal OUT+. The pass switches SA7, SA8, SB7, and SB8 and the capacitors CP7 and CP8 form a sample-and-hold unit 23 coupled to the negative input terminal IN− and the positive output terminal OUT+.

In the embodiment, the ON/OFF states of the pass switches SA1-SA8 are determined according to a clock signal CL21, while the ON/OFF states of the pass switches SB1-SB8 are determined according to a clock signal CL22. Thus, the operating of each sample-and-hold unit is involved with both the two clock signals CL21 and CL22. By the configurations of clock signals corresponding to the pass switches, the sample-and-hold units 21 and 24 may be regarded as one group, referred to as a first sample-and-hold set, and the sample-and-hold units 22 and 23 may be regarded as another group, referred to as a second sample-and-hold set.

Figure 3A:
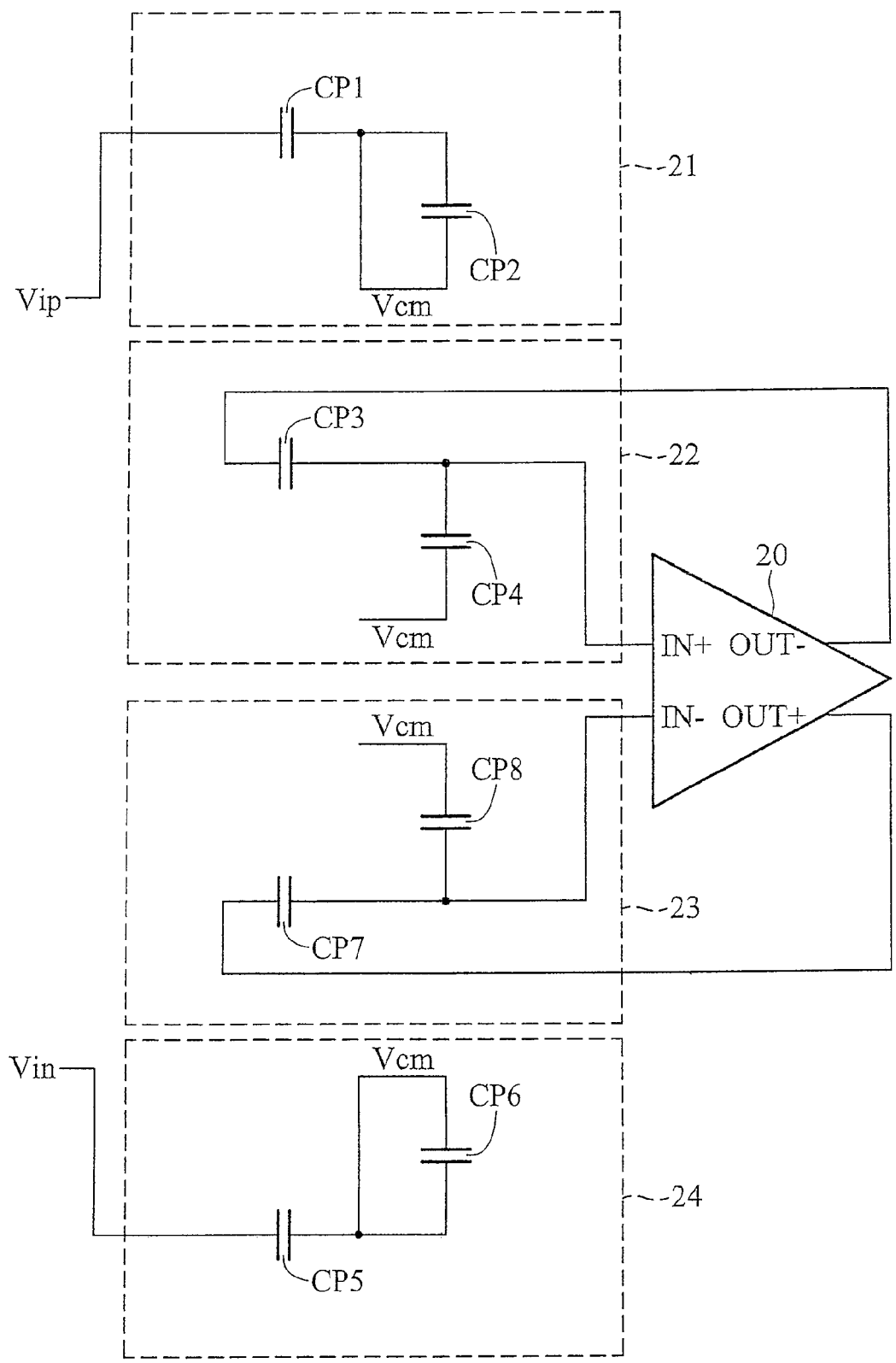
FIGS. 3a and 3b show the sample-and-hold amplification circuit of FIG. 2 during a first and second operating period.

During a first operational period, the pass switches SA1-SA8 are turned on according to the clock signal CL21, and the pass switches SB1-SB6 are turned off according to the clock signal CL22 which is inverse to the clock signal CL21, as shown in FIG. 3a. The sample-and-hold unit 21 receives and stores current positive input voltage Vip in the capacitor CP1 to perform a sampling operation. The sample-and-hold unit 24 receives and stores current negative input voltage Vin in the capacitor CP5 to perform a sampling operation. The sample-and-hold unit 22 holds a positive input voltage previously stored in the capacitor CP3 to perform a holding operation and couples the previous positive input voltage stored in the capacitor CP3 into the amplifier 20. The sample-and-hold unit 23 holds a negative input voltage previously stored in the capacitor CP7 to perform a holding operation and couples the previous negative input voltage stored in the capacitor CP7 into the amplifier 20. The amplifier 20 generates output voltage according to the previous input voltages stored in the capacitors CP3 and CP7.

Figure 3B:
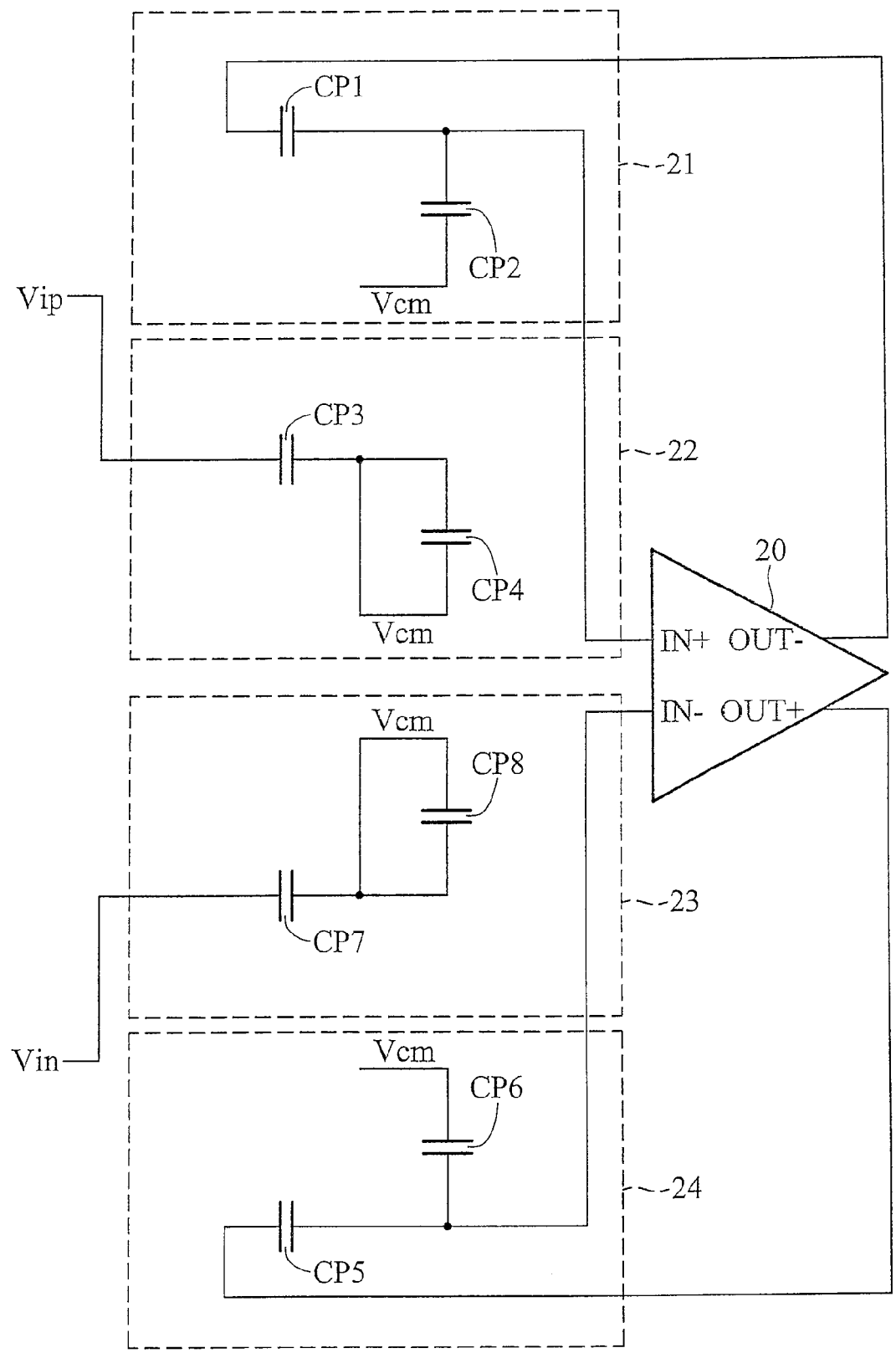

During a second operational period following the first operational period, the pass switches SB1-SB6 are turned on according to the clock signal CL22, and the pass switches SA1-SA8 are turned off according to the clock signal CL21, as shown in FIG. 3b. The sample-and-hold unit 22 receives and stores a next positive input voltage Vip in the capacitor CP3 to perform a sampling operation. The sample-and-hold unit 23 receives and stores a next negative input voltage Vin in the capacitor CP7 to perform a sampling operation. The sample-and-hold unit 21 holds the positive input voltage stored in the capacitor CP1 during the first operational period to perform a holding operation and couples the current positive input voltage stored in the capacitor CP1 into the amplifier 20. The sample-and-hold unit 24 holds the negative input voltage stored in the capacitor CP5 during the first operational period to perform a holding operation and couples the current negative input voltage stored in the capacitor CP5 into the amplifier 20. The amplifier 20 generates output voltage according to the current input voltages stored in the capacitors CP1 and CP5.

Figure 1:
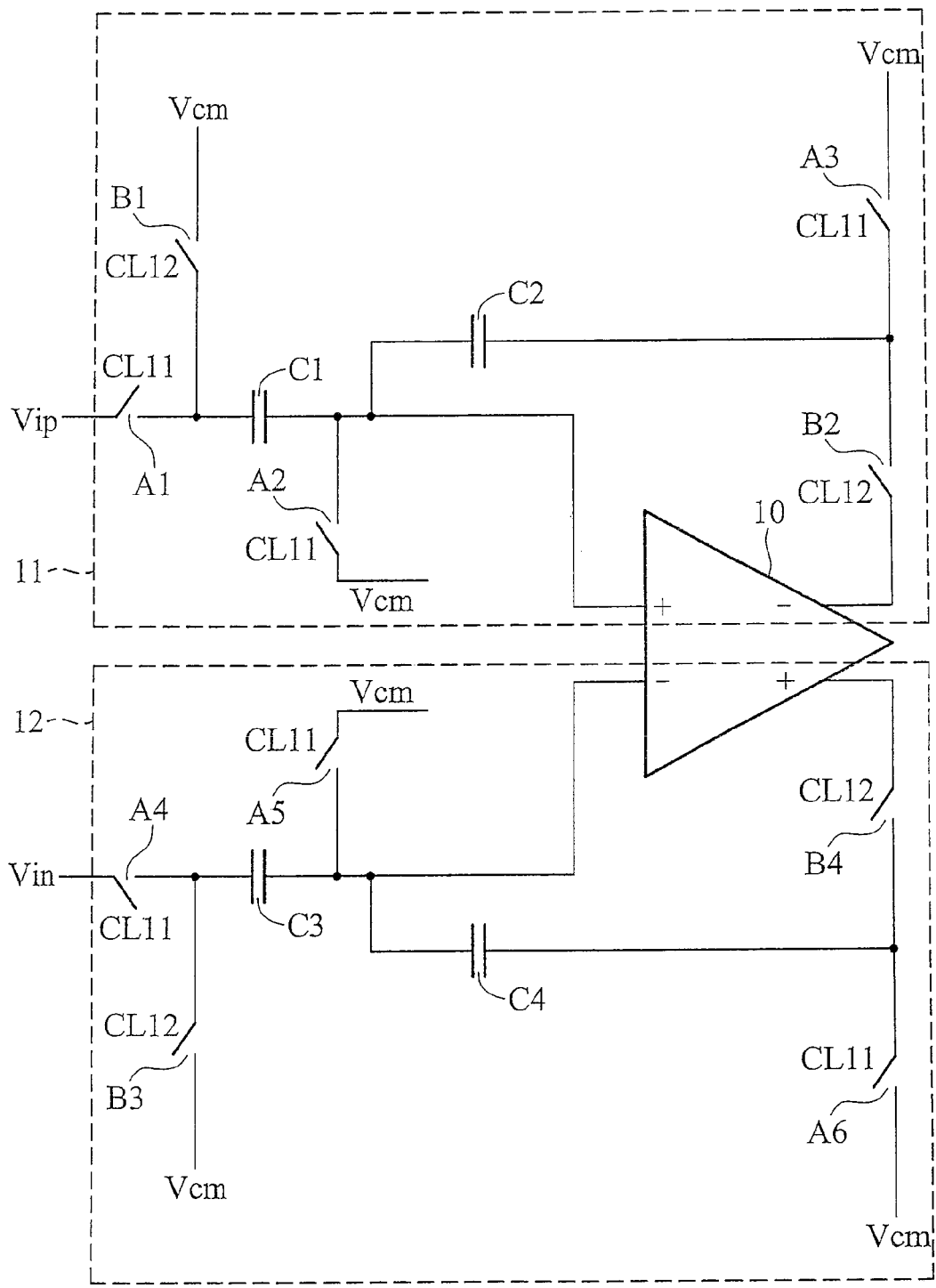
FIG. 1 shows a conventional sample-and-hold amplification circuit.

As the above describes, the sample-and-hold units 22 and 23 perform holding operations when the sample-and-hold units 21 and 24 perform sampling operations, and the sample-and-hold units 21 and 24 perform holding operations when the sample-and-hold units 22 and 23 perform sampling operations. By this architecture, the sample-and-hold amplification circuit 2 can perform the sampling operations and the holding operations with different sample-and-hold units simultaneously in each operational period. Compared to the conventional sample-and-hold amplification circuit 1 in FIG. 1, the clock rates of each of the sample-and-hold units in FIG. 2 is half that of each of the sample-and-hold units in FIG. 1, given the same sampling rates.

Figure 4A:
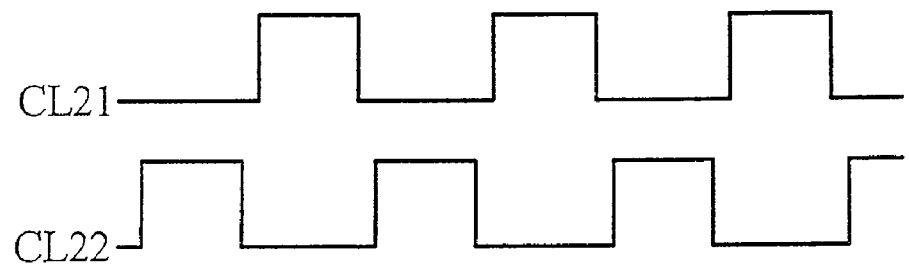
FIG. 4a shows a timing diagram of an exemplary embodiment of the clock signals CL21 and CL22 in FIG. 2.

FIG. 4a shows a timing diagram of the clock signals CL21 and CL22. In the embodiment, according to the high logic levels in the clock signals CL21 and CL22 (referred to active period), the corresponding pass switches are turned on. According to FIG. 4a, the clock signals CL21 and CL22 are non-overlapping. Moreover, the clock signals CL21 and CL22 may be inverted according to the types of pass switches.

Figure 4B:
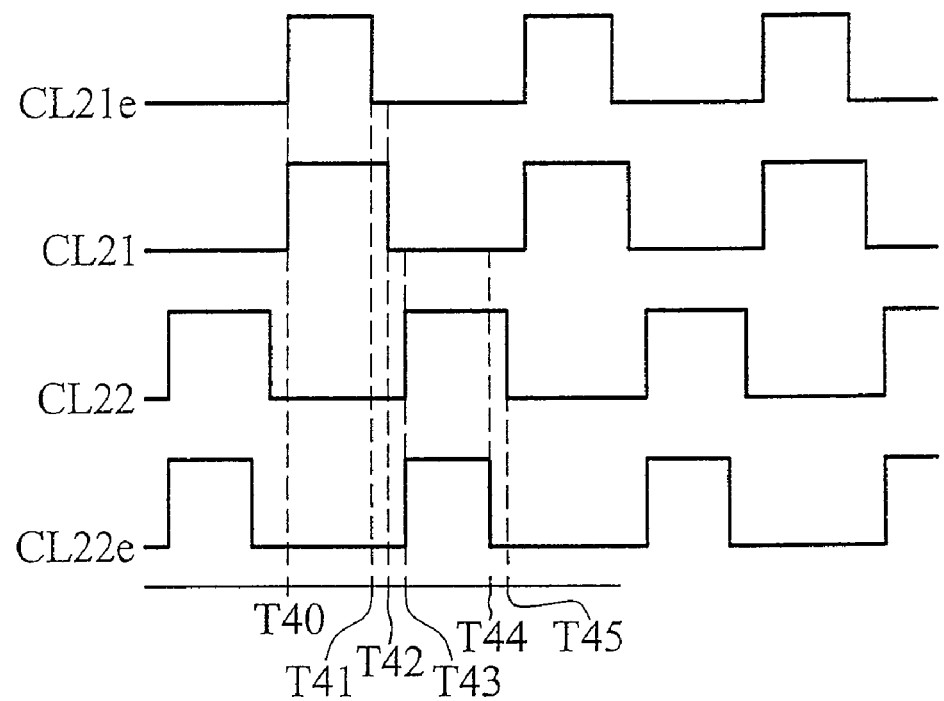
FIG. 4b shows a timing diagram of an other exemplary embodiment of the clock signals CL21, CL22, CL21e and CL22e in FIG. 2.

In another embodiment, ON/OFF states of the pass switches SA2, SA3, SA6, and SA7 are determined according to a clock signal CL21e, and ON/OFF states of the pass switches SB1, SB4, SB5, and SB8 are determined according to a clock signal CL22e, as shown in FIG. 4b. According to the high logic levels in the clock signals CL21e and CL22e (referred to active period), the corresponding pass switches are turned on. Referring to FIG. 4b, the active periods of the clock signals CL21 and CL21e begin at a time point T40, the active period of the clock signal CL21e ends at a time point T41 earlier than a time point T42 where the active period of the clock signal CL21 ends. The active periods of the clock signals CL22 and CL22e begin at a time point T43, the active period of the clock signal CL22e ends at a time point T44 earlier than a time point T45 where the active period of the clock signal CL22 ends.

Figure 5A:
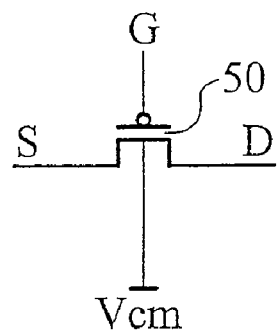
FIGS. 5a and 5b show exemplary embodiments of pass switches SB1, SA3, SB5, and SA7 in FIG. 2.
Figure 5B:
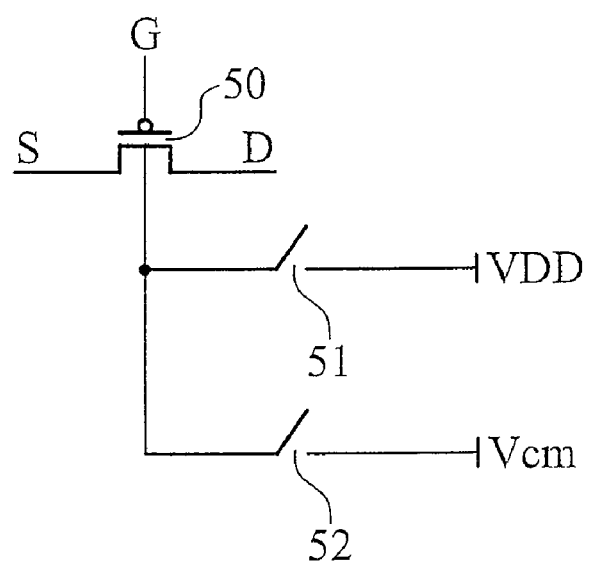

The pass switches SB1, SA3, SB5, and SA7 can be implemented by switch circuits of FIGS. 5a-5b. In some embodiment, referring to FIG. 5a, each of the pass switches SB1, SA3, SB5, and SA7 is implemented by a PMOS transistor 50 whose substrate is coupled to a common voltage Vcm. For example, if the pass switch SB1 is implemented by the transistor 50, the gate G of the transistor 50 is coupled to the clock signal CL22e (in practice, an inverted clock signal CL22e due to the nature of PMOS transistor), the source S thereof is coupled to the capacitor CP1, and the drain D thereof is coupled to the positive input terminal IN+. Because the voltages of source S and drain D are near to the common voltage Vcm, coupling the substrate of the PMOS transistor 50 to the common voltage Vcm instead of the general supply voltage VDD can decrease the turn-on resistance of the pass switch SB1.

In other embodiments as illustrated in FIG. 5b, the substrate of the PMOS transistor 50, which can be used to implement the pass switches SB1, is selectively coupled to the common voltage Vcm through a switch 52 or the supply voltage VDD through a switch 51. The leakage of the pass switch SB1 can be suppressed when the substrate of the transistor 50 is coupled to the supply voltage VDD, and the turn-on resistance of the pass switch SB1 can be decreased when the substrate of the transistor 50 is coupled to the common voltage Vcm. The switch 51 is turned on when the transistor 50 is turned off, and the switch 52 is turned on when the transistor 50 is turned on. More particularly, the gate of the PMOS transistor 50 and the switch 51 are controlled by the same signal (e.g. the inverted clock signal CL22e) while the switch 52 is controlled by another signal (e.g. the clock signal CL22e).

Figure 6:
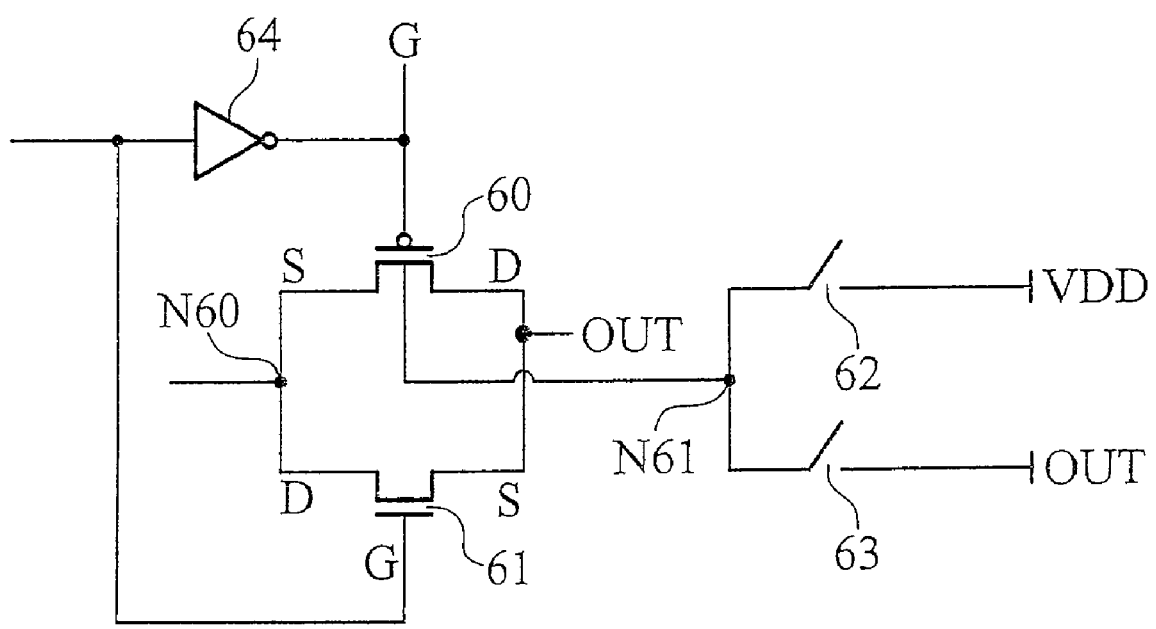
FIG. 6 shows another exemplary embodiment of pass switches SB2, SA4, SB6, and SA8 in FIG. 2.

The pass switches SB2, SA4, SB6, and SA8 can be implemented by a switch circuit of FIG. 6. In some embodiments, referring FIG. 6, each of the pass switches SB2, SA4, SB6, and SA8 comprises a transmission gate, which is implemented by a PMOS transistor 60 and a NMOS transistor 61, coupled between nodes N60 and the corresponding output terminal OUT. For example, if the pass switch SB2 is implemented by the transmission gate, the node N60 is coupled to the capacitor CP1, and the corresponding output terminal OUT is the negative output terminal OUT− of the amplifier 20. Moreover, the substrate of the PMOS transistor 60 is coupled to a node N61, which is selectively connected to supply voltage VDD through a switch 62 or the corresponding output terminal OUT through a switch 63. The leakage of the pass switch SB2 can be suppressed when the substrate of the transistor 60 is coupled to the supply voltage VDD, and the turn-on resistance of the pass switch SB2 can be decreased when the substrate of the transistor 60 is coupled to the corresponding output terminal OUT.

The switch 62 is turned on and the switch 63 is turned off when the transistors 60 and 61 are turned off; the switch 62 is turned off and the switch 63 is turned on when the transistors 60 and 61 are turned on. More particularly, the gate of the PMOS transistor 60 and the switch 62 are controlled by the same signal (e.g. the inverted clock signal CL22) while the gate of the NMOS transistor 61 and the switch 63 are controlled by another signal (e.g. the clock signal CL22).

Accordingly, the exemplary sample-and-hold amplification circuit 2 in FIG. 2 can illustrate at least two embodiments of the invention. In one aspect, an exemplary embodiment of the sample-and-hold amplification circuit comprises an amplifier 20, a sample-and-hold unit 21, and a sample-and-hold unit 22. The amplifier 20 has an input terminal, such as IN+, and an output terminal, such as OUT−. The sample-and-hold unit 21 is coupled to the input terminal IN+ and the output terminal OUT−. The sample-and-hold unit 22 is coupled to the input terminal IN+ and the output terminal OUT−. When the sample-and-hold unit 21 is arranged to perform a sampling operation, the sample-and-hold unit 22 performs a holding operation. When the sample-and-hold unit 21 is arranged to perform the holding operation, the sample-and-hold unit 22 performs the sampling operation.

In another aspect, another exemplary embodiment of the sample-and-hold amplification circuit comprises an amplifier 20, a sample-and-hold unit 21, and a sample-and-hold unit 23. The amplifier 20 has a positive input terminal IN+, a negative input terminal IN−, a positive output terminal OUT−, and a negative output terminal OUT+. The sample-and-hold unit 21 is coupled to the positive input terminal IN+ and the output terminal OUT−. The sample-and-hold unit 23 is coupled to the negative input terminal IN− and the positive output terminal OUT+. When the sample-and-hold unit 21 is arranged to perform a sampling operation, the sample-and-hold unit 23 performs a holding operation. When the sample-and-hold unit 21 is arranged to perform the holding operation, the sample-and-hold unit 23 performs the sampling operation.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A sample-and-hold amplification circuit, comprising:
    an amplifier having an input terminal and an output terminal;
    a first sample-and-hold unit coupled to the input terminal and the output terminal, for performing a sampling operation and a holding operation; and
    a second sample-and-hold unit coupled to the input terminal and the output terminal, for performing a sampling operation and a holding operation;
    wherein the first sample-and-hold unit performs the sampling operation and the holding operation according to a first clock signal, a second clock signal, a third clock signal, and a fourth clock signal;
    wherein active periods of the first and second clock signals begin at the same time, and the active period of the first clock signal is longer than the active period of the second clock signal;
    wherein active periods of the third and fourth clock signals begin at the same time, and the active period of the fourth clock signal is longer than the active period of the third clock signal;
    wherein the fourth clock signal and the first clock signal are non-overlapping;
    wherein when the first sample-and-hold unit is arranged to perform the sampling operation, the second sample-and-hold unit performs the holding operation; and
    wherein when the first sample-and-hold unit is arranged to perform the holding operation, the second sample-and-hold unit performs the sampling operation.

2. The sample-and-hold amplification circuit as claimed in claim 1,
    wherein in a first operational period, the first sample-and-hold unit is arranged to receive and store a current input voltage, and the second sample-and-hold unit is arranged to couple a previous input voltage into the amplifier; and
    wherein in a second operational period, the first sample-and-hold unit is arranged to couple the current input voltage received in the first operational period into the amplifier, and the second sample-and-hold unit is arranged to receive and store a next input voltage.

3. The sample-and-hold amplification circuit as claimed in claim 1, wherein each of the first and second sample-and-hold units comprises:
    a first pass switch coupled between a first node and a second node;
    a first capacitor coupled between the second node and a third node;
    a second pass switch coupled between the third node and a common voltage;
    a second capacitor coupled between the third node and the common voltage;
    a third pass switch coupled between the third node and the input terminal; and
    a fourth pass switch coupled the second node and the output terminal.

4. The sample-and-hold amplification circuit as claimed in claim 3,
    wherein in the first sample-and-hold unit, ON/OFF states of the first, second, third, and fourth pass switches are determined respectively according to the first, second, third, and fourth clock signals.

5. The sample-and-hold amplification circuit as claimed in claim 4, wherein in the second sample-and-hold unit, ON/OFF states of the first, second, third, and fourth pass switches are determined respectively according to the fourth, third, second, and first clock signals.

6. The sample-and-hold amplification circuit as claimed in claim 3 wherein the third pass switch is a transistor whose substrate is coupled to the common voltage.

7. The sample-and-hold amplification circuit as claimed in claim 3, wherein the third pass switch is a transistor whose substrate is selectively coupled to one of a supply voltage and the common voltage.

8. The sample-and-hold amplification circuit as claimed in claim 3, wherein the fourth pass switch comprises a transmission gate having an input node and an output node, the input node is coupled to the second node, and the output node is coupled to the output terminal.

9. A sample-and-hold amplification circuit, comprising:
an amplifier having a first-polarity input terminal, a second-polarity input terminal, a first-polarity output terminal, and a second-polarity output terminal;
a first sample-and-hold unit coupled to the first-polarity input terminal and the second-polarity output terminal; and
a second sample-and-hold unit coupled to the second-polarity input terminal and the first-polarity output terminal;
wherein each of the first second sample-and-hold units comprises:
a first pass switch coupled between a first node and a second node;
a first capacitor coupled between the second node and a third node;
a second pass switch coupled between the third node and a common voltage;
a second capacitor coupled between the third node and the common voltage;
a third pass switch coupled between the third node and the corresponding input terminal of the amplifier; and
a fourth pass switch coupled the second node and the corresponding output terminal of the amplifier;
wherein when the first sample-and-hold unit is arranged to perform a sampling operation, the second sample-and-hold unit performs a holding operation; and
wherein when the first sample-and-hold unit is arranged to perform the holding operation, the second sample-and-hold unit performs the sampling operation.

10. The sample-and-hold amplification circuit as claimed in claim 9,
wherein in a first operational period, the first sample-and-hold unit is arranged to receive and store a current input voltage, and the second sample-and-hold unit is arranged to couple a previous input voltage into the amplifier;
wherein in a second operational period, the first sample-and-hold unit is arranged to couple the input voltage received in the first operational period into the amplifier, and the second sample-and-hold unit is arranged to receive and store a next input voltage.

11. The sample-and-hold amplification circuit as claimed in claim 9,
wherein in the first sample-and-hold unit, ON/OFF states of the first and second pass switches are determined according to a first clock signal, and ON/OFF states of the third and fourth pass switches are determined according to a second clock signal different from the first clock signal; and
wherein in the second sample-and-hold unit, ON/OFF states of the first and second pass switches are determined according to the second clock signal, and ON/OFF states of the third and fourth pass switches are determined according to the first clock signal.

12. The sample-and-hold amplification circuit as claimed in claim 11, wherein the second clock signal and the first clock signal are non-overlapping.

13. The sample-and-hold amplification circuit as claimed in claim 9,
wherein in the first sample-and-hold unit, ON/OFF states of the first, second, third, and fourth pass switches are determined respectively according to first, second, third, and fourth clock signals;
wherein active periods of the first and second clock signals begin at the same time, and the active period of the first clock signal is longer than the active period of the second clock signal;
wherein active periods of the third and fourth clock signals begin at the same time, and the active period of the fourth clock signal is longer than the active period of the third clock signal; and
wherein the fourth clock signal and first clock signal are non-overlapping.

14. The sample-and-hold amplification circuit as claimed in claim 13, wherein in the second sample-and-hold unit, ON/OFF states of the first, second, third, and fourth pass switches are determined respectively according to the fourth, third, second, and first clock signals.

15. The sample-and-hold amplification circuit as claimed in claim 9 further comprising:
a third sample-and-hold unit coupled to the first-polarity input terminal and the second-polarity output terminal; and
a fourth sample-and-hold unit coupled to the second-polarity input terminal and the first-polarity output terminal;
wherein when the first sample-and-hold unit is arranged to perform the sampling operation, the third sample-and-hold unit performs the holding operation, and the fourth sample-and-hold unit performs the sampling operation; and
wherein when the first sample-and-hold unit is arranged to perform the holding operation, the third sample-and-hold unit performs the sampling operation, and the fourth sample-and-hold unit performs the holding operation.

* * * * *